United States Patent [19]

Gorczyca

[11] Patent Number: 5,492,586
[45] Date of Patent: Feb. 20, 1996

[54] METHOD FOR FABRICATING ENCASED MOLDED MULTI-CHIP MODULE SUBSTRATE

[75] Inventor: Thomas B. Gorczyca, Schenectady, N.Y.

[73] Assignee: Martin Marietta Corporation, King of Prussia, Pa.

[21] Appl. No.: 265,051

[22] Filed: Jun. 24, 1994

Related U.S. Application Data

[63] Continuation-in-part of Ser. No. 143,519, Oct. 29, 1993, abandoned.

[51] Int. Cl.⁶ ............................................. B32B 3/10
[52] U.S. Cl. ...................... 156/245; 29/841; 264/272.14; 264/272.15; 264/272.17
[58] Field of Search .................... 156/230, 245; 264/272.11, 272.14, 272.15, 272.17, 275, 277; 437/207, 209, 219; 29/845, 855, 856, 883, 841

[56] References Cited

U.S. PATENT DOCUMENTS

| | | | |
|---|---|---|---|
| 3,364,567 | 1/1968 | Brown et al. | 29/856 |
| 4,783,695 | 11/1988 | Eichelberger et al. | 357/65 |
| 4,913,930 | 4/1990 | Getson | 437/219 |
| 5,032,543 | 7/1991 | Black et al. | 437/219 |
| 5,041,396 | 8/1991 | Valero | 437/209 |
| 5,063,177 | 11/1991 | Geller et al. | 437/219 |
| 5,149,387 | 9/1992 | Moore, Sr. | 264/272.15 |
| 5,224,265 | 7/1993 | Dux et al. | 29/852 |

*Primary Examiner*—Michael W. Ball
*Assistant Examiner*—Richard Crispino
*Attorney, Agent, or Firm*—Brian J. Rees; Geoffrey H. Krauss

[57] ABSTRACT

A method for fabricating a multi-chip module substrate comprises providing a carrier having a well. Substrate molding material is poured into the carrier well. A plurality of chips is situated in the substrate molding material. A laminatable dielectric layer is laminated over the substrate molding material at a predetermined temperature and a predetermined pressure so that the substrate molding material flows and encapsulates the chips.

16 Claims, 11 Drawing Sheets

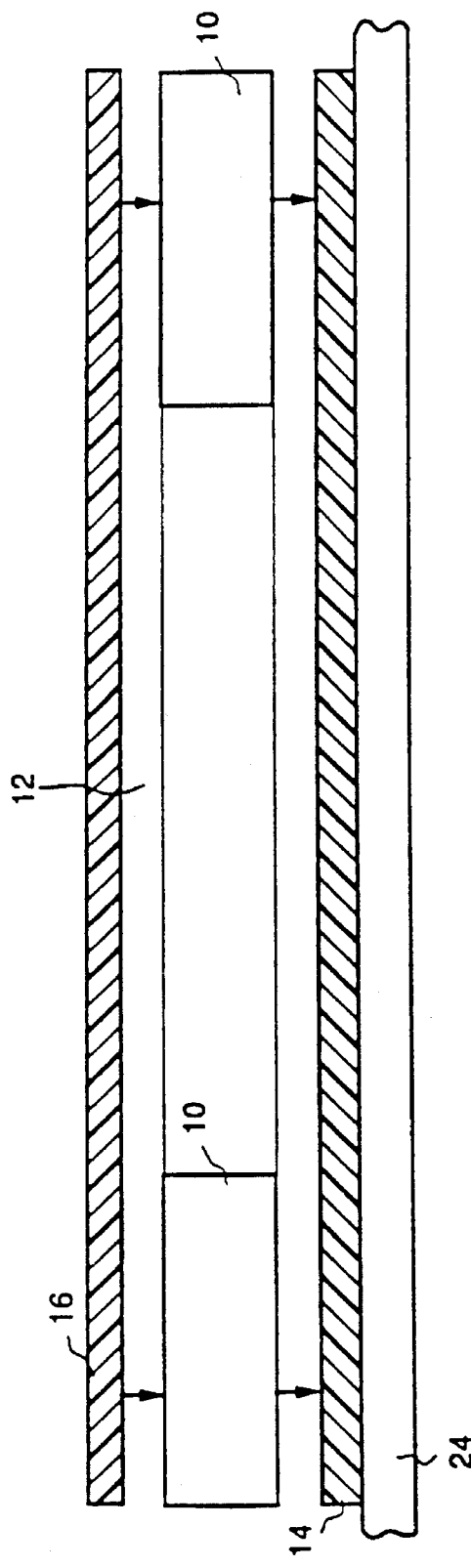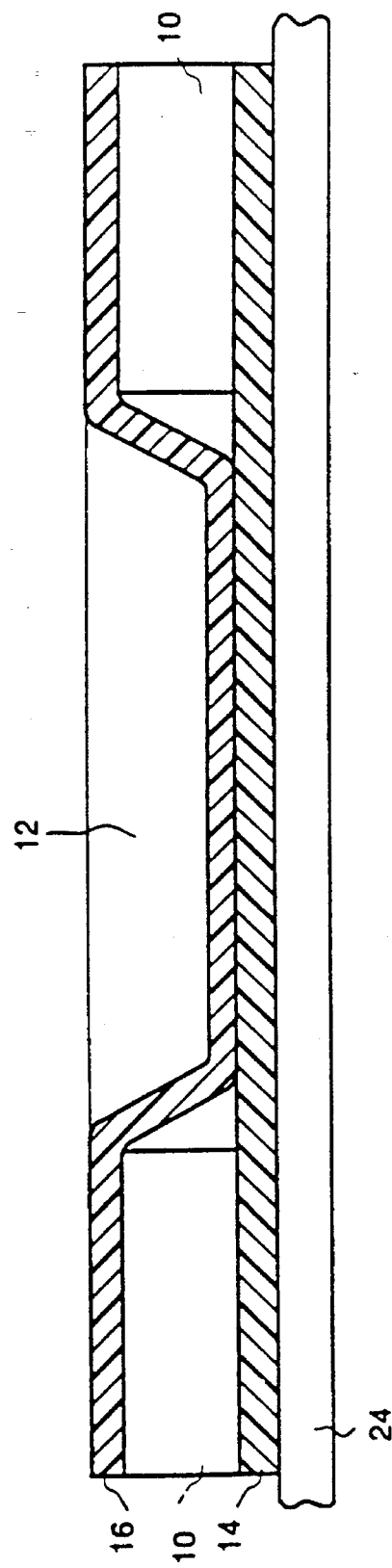

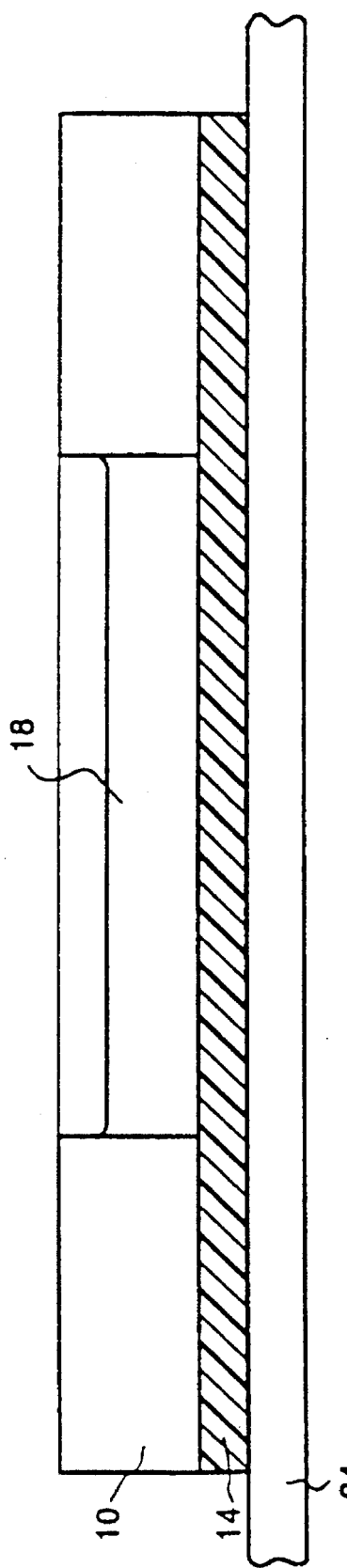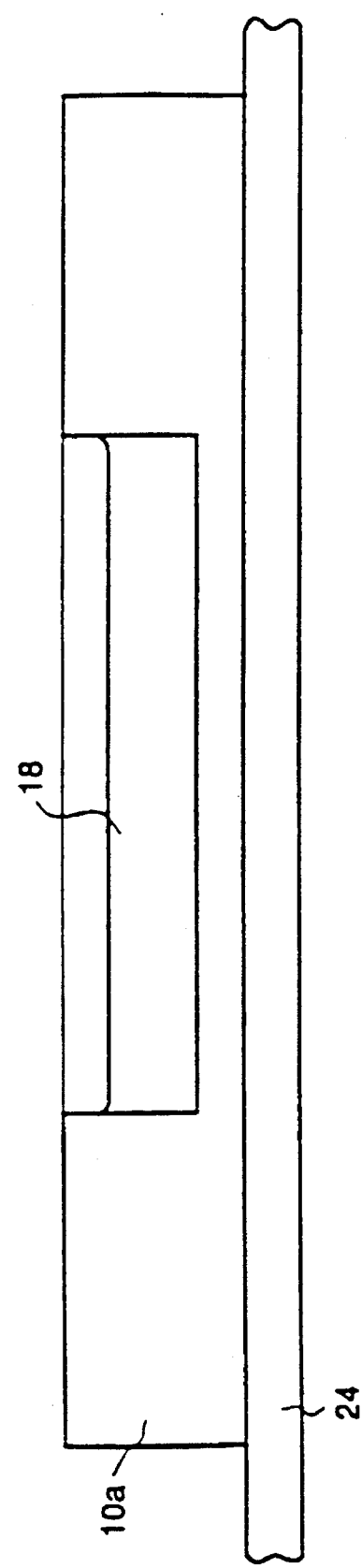

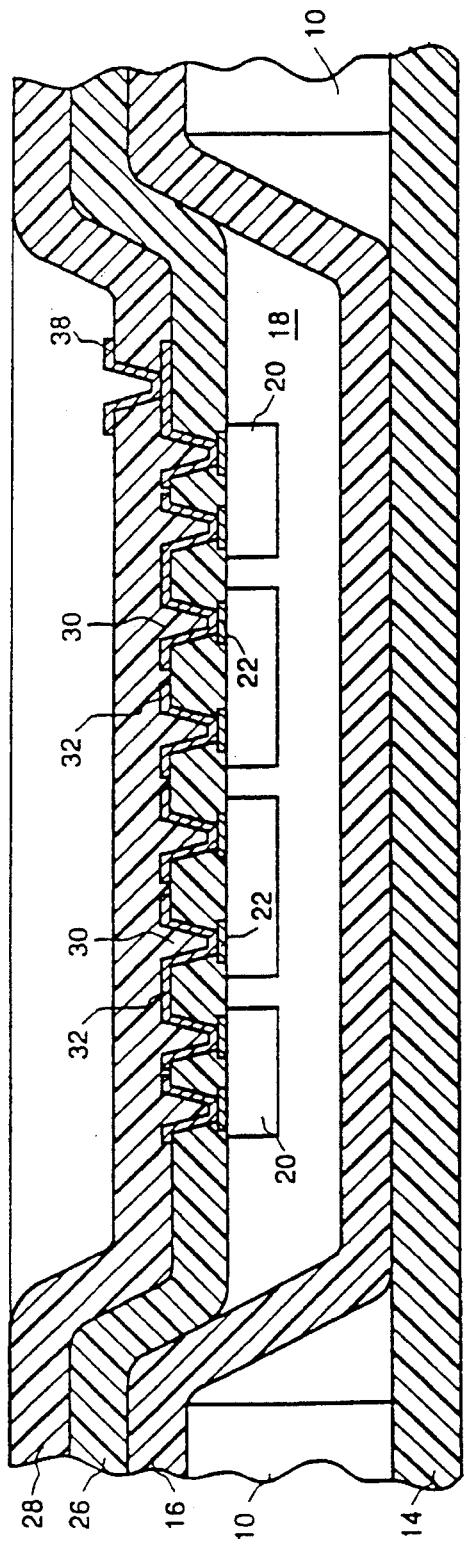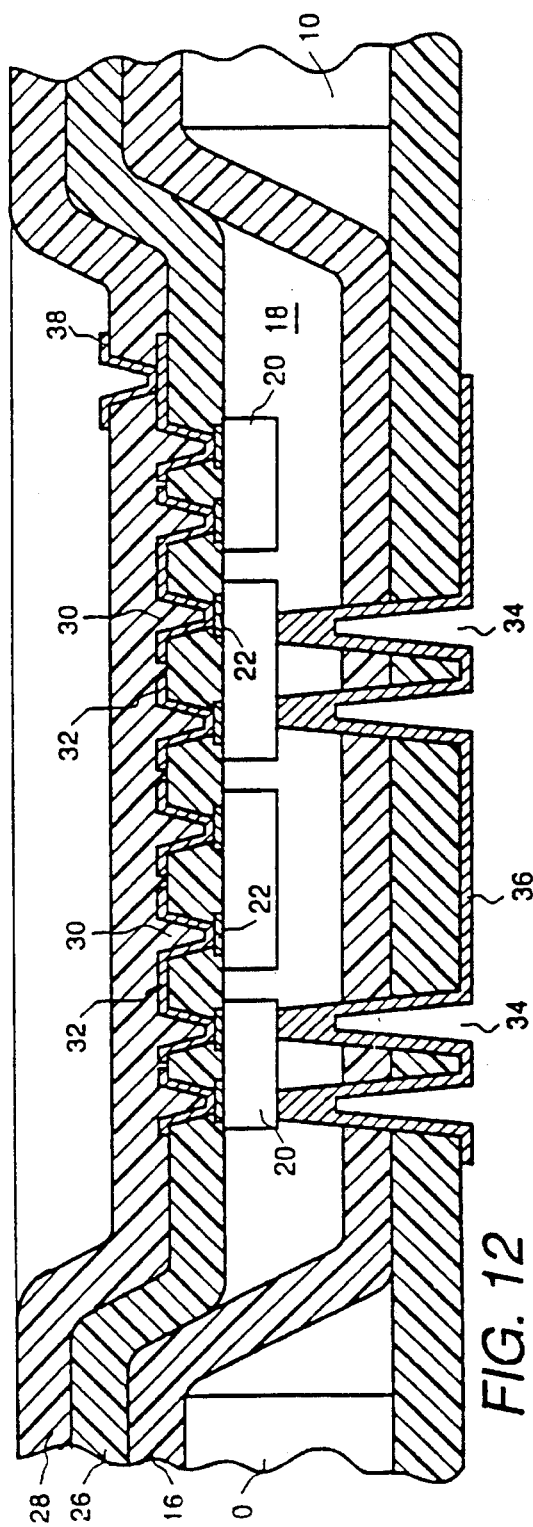

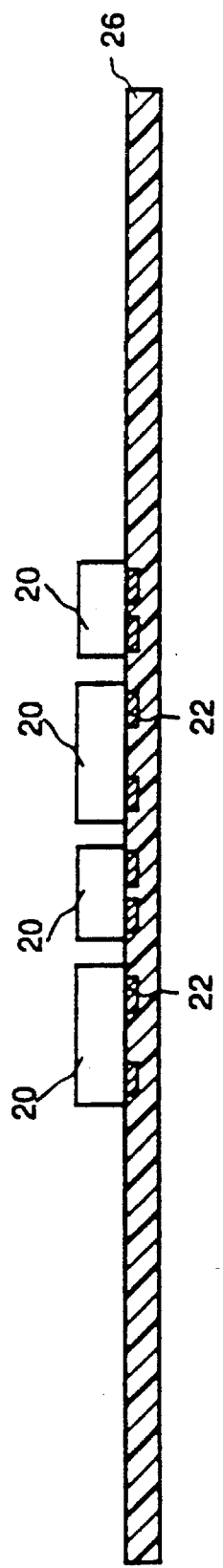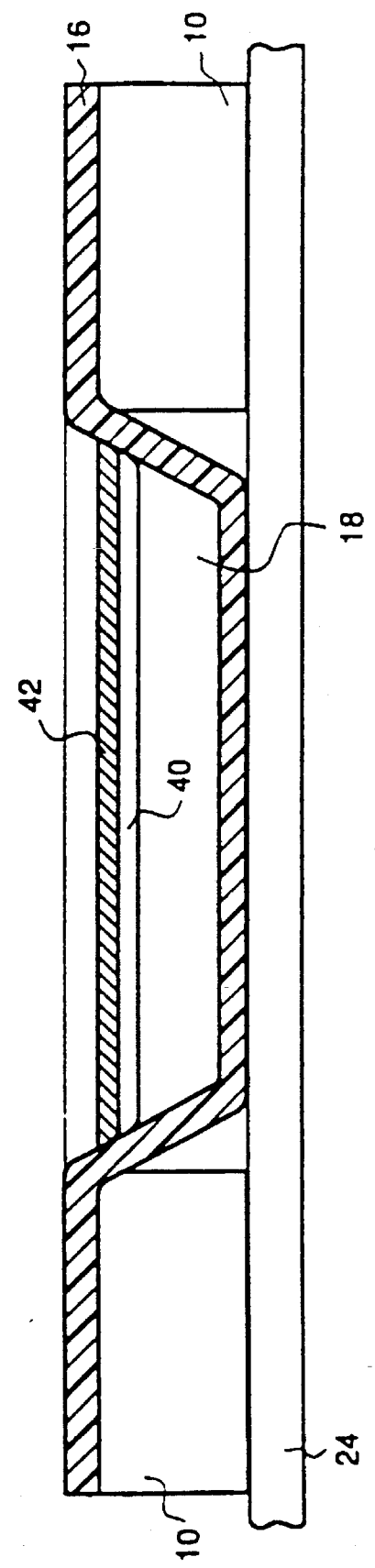

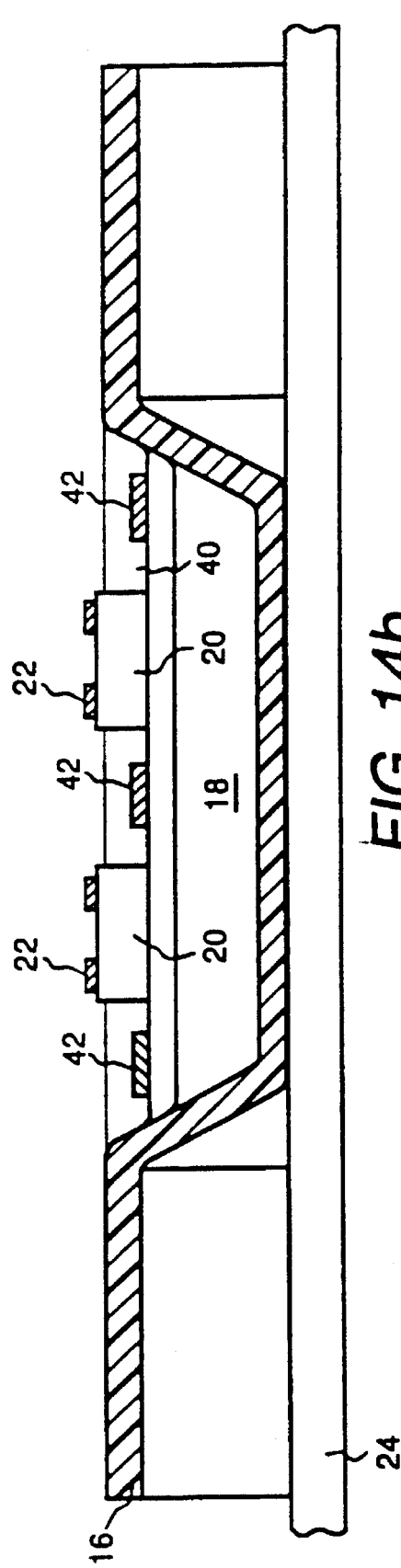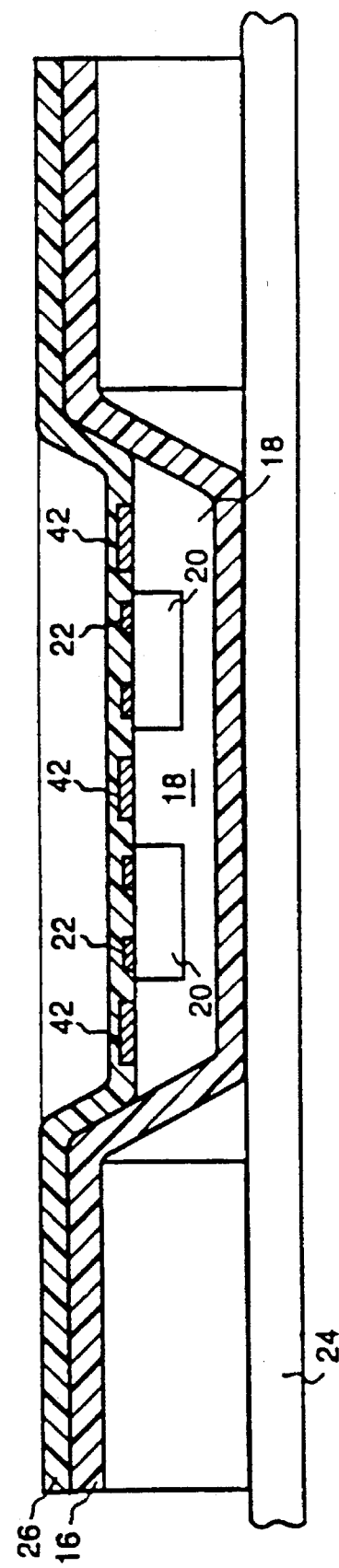

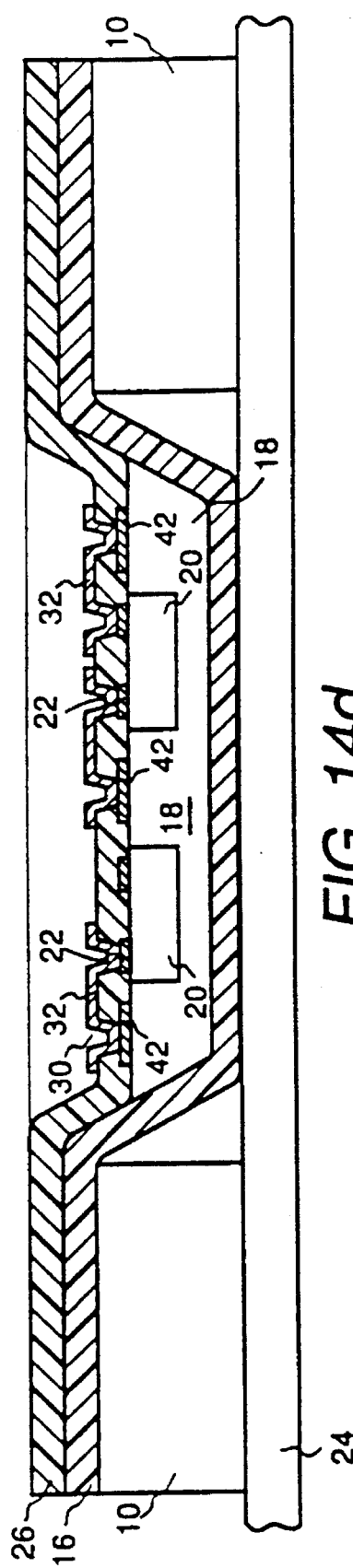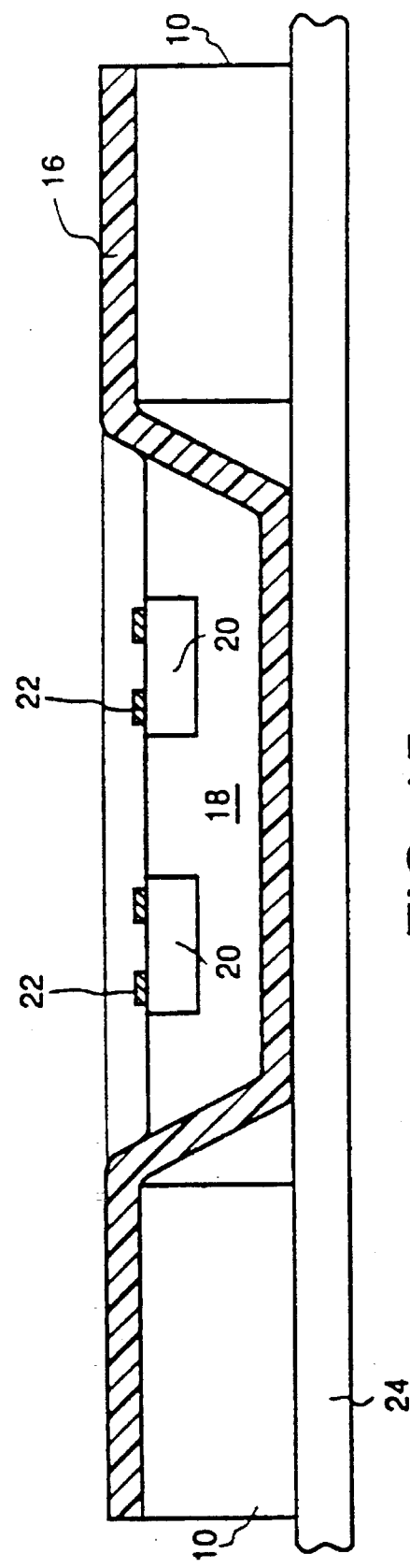

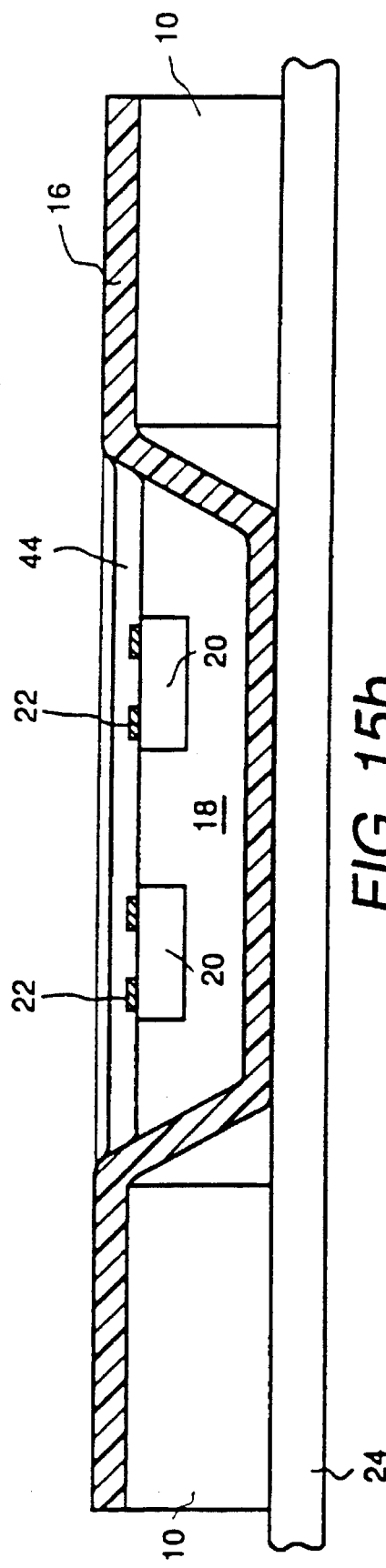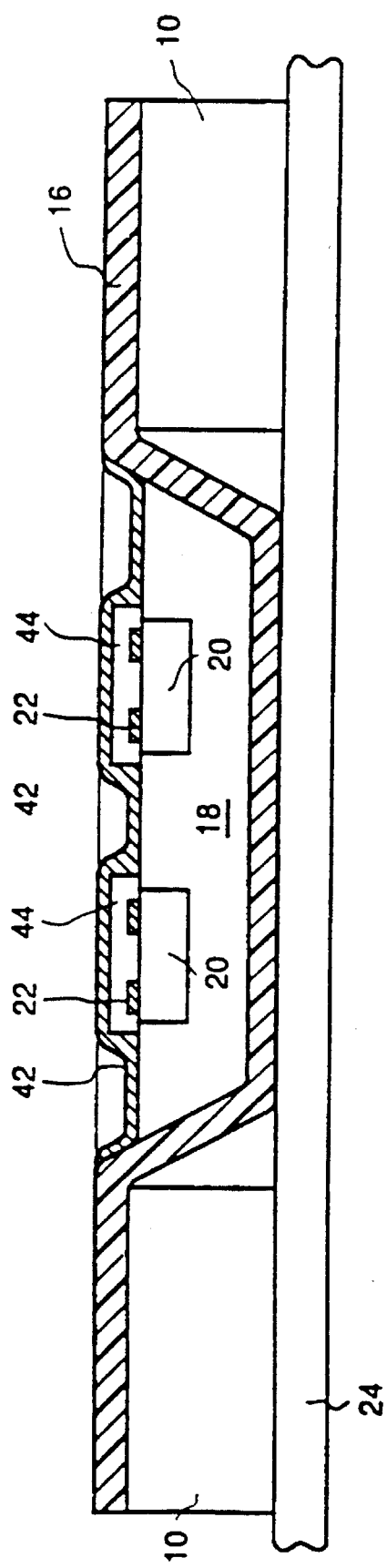
FIG. 15b
FIG. 15c

METHOD FOR FABRICATING ENCASED MOLDED MULTI-CHIP MODULE SUBSTRATE

CROSS REFERENCE TO RELATED APPLICATIONS

This application is a continuation-in-part of application Ser. No. 08/143,519, filed Oct. 29, 1993, entitled "Encased Integral Molded Plastic Multi-chip Module Substrate and Fabrication Process" to T. Gorczyca, now abandoned. This application is related to applications which are assigned to a common assignee: Fillion et al, "Embedded Substrate for Integrated Circuit Modules", application Ser. No. 08/087,434, filed Jul. 9, 1993, now U.S. Pat. No. 5,353,498, issued Oct. 11, 1994, which is a continuation-in-part of application Ser. No. 08/014,481, filed Feb. 8, 1993, now abandoned; and application Ser. No. 08/391,337, filed Feb. 21, 1995 which is a continuation of application Ser. No. 08/143,092 to Gorczyca et al entitled "Contact Areas for Plastic Multi-chip Module Substrates", filed Oct. 29, 1993, now abandoned.

BACKGROUND OF THE INVENTION

1. Field of the Invention

This invention relates generally to multi-chip modules and, more particularly, to a technique for fabricating an embedded chip substrate.

2. Description of the Related Art

Conventional high density interconnect (HDI) processes often use cavities formed into a substrate base for the placement of chips so that the top surfaces of the chips are essentially planar with the surface of the substrate. The substrate is generally a ceramic or a composite structure. The conventional HDI technique for fabricating cavities in the substrate is to mechanically machine or mill out the cavity material with a computer-controlled diamond tooled bit. This time consuming process does not always provide the desired chip cavity depth and can result in cracks which render the substrate unusable.

In the conventional HDI process, chips are placed into cavities on multiple drops of die attach adhesive for mechanical, thermal, and electrical mounting. Chips placed with this process can be displaced during further processing because there are non-uniform surface tension forces at the chip-to-die attach adhesive inter-face. This displacement reduces precision in chip location, and further processing steps are required to adapt each electrical interconnection to the chip misalignment. Furthermore, a moat (gap) is present between each chip and the walls of its respective well.

In conventional HDI techniques, an adhesive-coated polymer film overlay covers a plurality of integrated circuit chips in chip wells on an underlying substrate. The polymer film provides an insulated layer upon which is deposited a metallization pattern for interconnection of individual circuit chips. Methods for performing a HDI process using overlays are described in Eichelberger et al., U.S. Pat. No. 4,783,695, issued Nov. 8, 1988, and in Eichelberger et al., U.S. Pat. No. 4,933,042, issued Jun. 12, 1990, both of which are hereby incorporated by reference. Additionally, it is desirable to provide via openings or apertures in the polymer film overlay so as to be able to provide electrical connection between various parts of a chip or between several chips. Eichelberger et al., U.S. Pat. No. 4,894,115, issued Jan. 16, 1990, which is hereby incorporated herein by reference, discloses embodiments for providing such apertures. Furthermore, methods for gaining access to and replacing a defective integrated circuit chip are disclosed in Eichelberger et al., U.S. Pat. No. 4,878,991, issued Nov. 7, 1989, and Wojnarowski et al., U.S. Pat. No. 5,154,793, issued Oct. 13, 1992, which are hereby incorporated by reference.

The presence of moats surrounding the chips in conventional substrates may cause thinning of the adhesive of the polymer film at the chip perimeters and sagging of the polymer film over the moats, thus adding difficulty in placing vias and patterning interconnects close to the chip wells. Additionally, mismatches between the coefficients of thermal expansion of ceramic substrates and polymer overlays sometimes induce stress at the adhesive layer, thus tending to promote separation of the polymer film from the substrate.

Eichelberger, U.S. Pat. No. 5,091,769 issued Feb. 25, 1992, describes an integrated circuit package formed by placing integrated circuit chips backside down on a substrate, encapsulating the faces and sides of the chips, fabricating vias and interconnections through the encapsulant to the contact pads for testing and burn in procedures, and removing the encapsulant after testing. When chips of differing thicknesses are used in a single multi-chip module (MCM), their pads are not situated in a common plane, so this method requires either that some of the chips be thinned or that the vias be of varying depths. Additionally, this technique involves a step of mechanical grinding for planarizing the surface and the use of an encapsulant material which is removed after testing.

Aforementioned Fillion et al., application Ser. No. 08/087,434, discloses a method of fabricating an HDI substrate by molding plastic around chips placed on a film, thus eliminating the milling process and providing a planar surface without moats between chips and the substrate. Briefly, the technique includes applying an insulative base sheet over a base. At least one chip having contact pads is placed face down on the base sheet. A mold form is positioned around a desired perimeter and surrounds at least one chip. Substrate molding material is added and then hardened within the mold form. Then the mold form and base are removed, the substrate is inverted, and the chips are interconnected.

It would be desirable to have a plastic molding process in which the mold form becomes an integral part of the substrate that protects the substrate from exposure to chemicals. Additionally, it would be desirable to have a process in which the substrate can be kept in the same orientation throughout the process of molding and chip interconnection.

SUMMARY OF THE INVENTION

Accordingly, an object of the invention is to provide a low temperature method for preparing an embedded plastic chip substrate encased with a fully cured, polymeric film which enhances chemical resistance and forms an integral portion of a chip interconnection layer.

Another object of the invention is to provide a chip embedding technique using a molding pocket for preparation of an embedded chip substrate which becomes an integral part of the substrate.

Another object of the invention is to provide a chip embedding and interconnection technique using a standard fixed carrier in which varying sized pockets and substrates are prepared and processed through subsequent interconnection steps.

Briefly, according to a preferred embodiment of the invention, a method for fabricating a multi-chip module substrate comprises providing a carrier having a well. Substrate molding material is poured into the carrier well. A plurality of chips are situated in the substrate molding material. A laminatable dielectric layer is laminated over the substrate molding material at a predetermined temperature and a predetermined pressure so that the substrate molding material flows and encapsulates the chips.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIG. 1 is a sectional side view of a carrier having a well, a base supporting a base sheet to which the carrier will be attached, and a protective dielectric layer which will be applied to the carrier;

FIG. 2 is a view similar to that of FIG. 1, further showing the base sheet and protective dielectric layer on the carrier;

FIG. 9 is a view similar to that of FIG. 3, showing an alternative embodiment without a protective dielectric layer;

FIG. 10 is a view similar to that of FIG. 6, showing an alternative embodiment without a protective dielectric layer;

FIG. 11 is a view similar to that of FIG. 5, further showing vias and interconnections through the laminatable dielectric layer and an outer dielectric layer;

FIG. 12 is a view similar to that of FIG. 11, further showing vias and thermal paths for the chip backsides;

FIG. 13 is a view of chips embedded in a laminatable dielectric layer;

FIGS. 14(a)–14(d) are views illustrating a process for applying a laminatable metal pattern on the substrate molding material; and FIGS. 15(a)–15(d) are views illustrating a process for leaving chips uncovered and applying a laminatable metal pattern,

DETAILED DESCRIPTION OF PREFERRED EMBODIMENTS OF THE INVENTION

Figure 3:
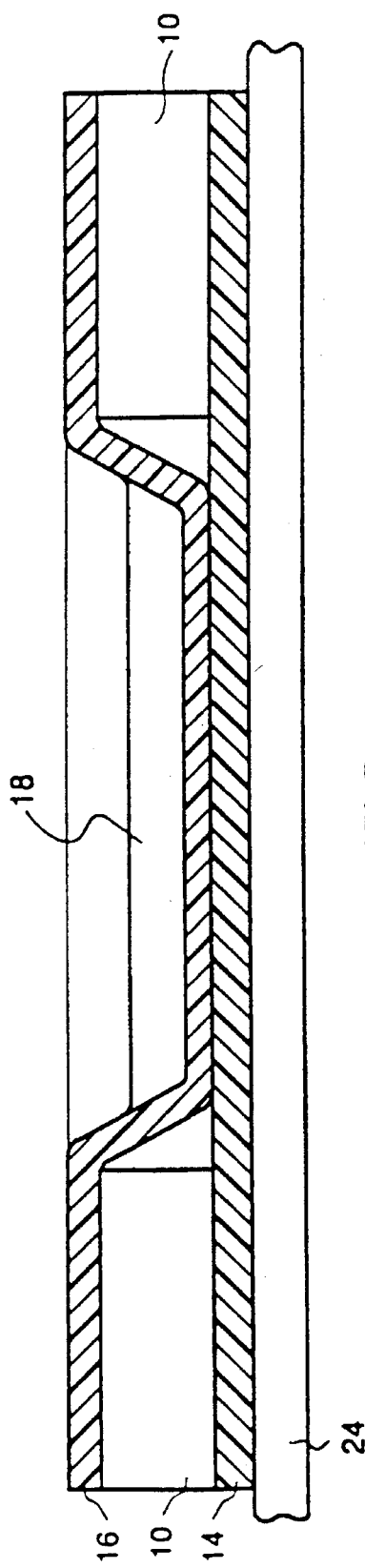
FIG. 3 is a view similar to that of FIG. 2, further showing substrate molding material in the carrier well.

FIG. 1 is a sectional side view of a backless carrier 10 having a well 12 for use in the present invention. Carrier 10 can comprise any suitable structural material and preferably comprises a ceramic or a metal such as titanium, for example. Well 12 can be formed by punching holes through sheet metal, for example. A base 24 supports a base sheet 14 to which carrier 10 will be attached (thus forming a bottom surface of well 12) and a protective dielectric layer 16 which will be applied to the carrier. Base 24 can comprise any suitable structural material which can withstand temperatures as high as 200° C., such as, titanium or Stainless steel, for example. Base sheet 14 and protective dielectric layer 16 each comprises a material which can support the carrier and its contents during subsequent processing, such as, for example, thermoplastic and thermoset polymers. The material of protective dielectric layer 16 must additionally be capable of being applied to the well of the carrier and to the surface of base sheet 14.

FIG. 2 is a view further showing base sheet 14 and protective dielectric layer 16 on carrier 10 of FIG. 1. In one embodiment, carrier 10 is positioned on a base sheet comprising 5 mils of KAPTON® polyimide (E.I. du Pont de Nemours and Co., Wilmington, Del.) covered with a thermoplastic adhesive coating comprising ULTEM® polyetherimide (General Electric Co., Fairfield, Conn.). After the carrier is positioned on the base sheet, it is overlaid with protective dielectric layer 16, preferably comprising a 2 mil thick layer of KAPTON® polyimide covered with a thermoplastic adhesive coating comprising ULTEM® polyetherimide. The entire structure is heated to a temperature of about 300° C. which is above the softening point of the ULTEM® polyetherimide adhesive layer (which is about 215° C.) while applying pressure to the structure's top surface to bond the KAPTON® polyimide film to the carrier 10 and complete the fabrication of well 12. Other thermoplastic or thermosetting adhesives can be used with KAPTON® polyimide films for forming well 12, providing they are stable to subsequent module fabrication steps.

The surface of the protective dielectric layer is then exposed to an oxygen plasma treatment to promote adhesion. At this point, the carrier can be lifted away from the base, if desired, because the base sheet and protective dielectric layer, which are stiff and form a molding pocket, need no additional support during subsequent processing. The advantage of using the base sheet in addition to the protective dielectric layer is that the base sheet is useful for holding the protective dielectric layer in place during the subsequent molding process.

FIG. 3 is a view further showing substrate molding material 18 in the carrier well of FIG. 2. According to one embodiment of the present invention, this material may comprise an epoxy/polyimide solution. If so, the epoxy and polyimide chosen must be compatible with each other and the solvent used to dissolve both components. Also, the epoxy and polyimide must be capable of withstanding any subsequent processing temperatures. For example, polyimides such as siloxane and polyetherimide are both compatible with epoxy resins such as cycloaliphatic, bisphenol-A, and novolac type epoxies. Stress on the package is minimized when the substrate molding material and protective dielectric layer 16 are similar materials and hardened simultaneously at low temperatures.

The carrier is weighed before and after the molding material is added. The material is then heated to partially cure the solution and remove solvent. The need for repetitions of the solution addition and partial cure steps varies with the desired thickness of the substrate. Extremely accurate solvent loss determinations can be made by weighing carrier 10 after each repetition.

The material can be prepared from epoxies, such as cycloaliphatic, bisphenol-A, and novolac type resins, alone, thus eliminating the need for a partial cure, in embodiments which do not include ablation (or ultraviolet absorption) of molding material 18. Alternatively, an epoxy solution can be prepared with polymers other than polyimides, such as, for example, polysulfone. Epoxy resins of widely different viscosities can be obtained, ranging from a 100 centipoise viscosity liquid at room temperature for the cycloaliphatic epoxy resin to greater than 50,000 centipoise viscosity semi-solid at a temperature of 150° C. for high molecular weight bisphenol-A resins. These resins can be blended together, or combined with high molecular weight, high viscosity polymers to tailor the viscosity characteristics of the uncured substrate molding material as well as its final cured properties.

According to a preferred embodiment of the present invention, the molding material may by processed solventless. By solventless we mean the molding material is mixed together and heated to produce a part which is substantially homogeneous. There is no need to use solvents of any of the materials during processing. For example, finely ground siloxane polyimide powder (such as D9000 from GE Plastics, MT. Vernon, Ind.) can be mixed with an epoxy resin powder (such as DER 662 from Dow Chemical Co., Midland, Mich.) and a catalyst (such as Octacat from GE Silicones, Waterford, N.Y.) to form a dry powder blend for use as the molding material for a HDI substrate. Formation of the substrate is accomplished by placing the dry powder blend in the carrier, followed by heating and applying pressure by use of a frame press or vacuum/pressure laminator. Heating the powder mixture results in melting and mixing of all its components, completely blending the materials together and subsequently curing the epoxy due to the presence of the catalyst. This process eliminates the need to remove solvent making the fabrication process much less costly, faster and environmentally friendly. It also enables the use of polymer and epoxy materials in any proportion and eliminates problems of incompatibility between the polymer(s) and epoxy resin(s) and the specific solvents useful for each component.

Incorporation of fillers, such as ceramic or metal oxide powders, into the epoxy resin or epoxy and polymer blends can further tailor the cured substrate material's properties such as its thermal conductivity and coefficient of thermal expansion. Common fillers which can be added into the blends include fumed or fused silica, silicon nitride, titanium oxide, magnesium oxide, zinc oxide, and aluminum oxide or aluminum nitride powders.

Control over the curing characteristics of the molding material can be obtained by altering the amount of catalyst used in the epoxy blend as well as the cure temperature profile. The curing time can be reduced by increasing the curing temperature and the curing temperature can be reduced if the curing time is increased. Alternatively, increasing the catalyst content will allow reduction in the curing time or temperature, while reducing the catalyst content will require longer curing times at higher temperatures. Numerous compatible polymer and epoxy mixtures can be prepared and their curing properties controlled to allow custom design of the uncured and final cured substrate properties.

Figure 4:
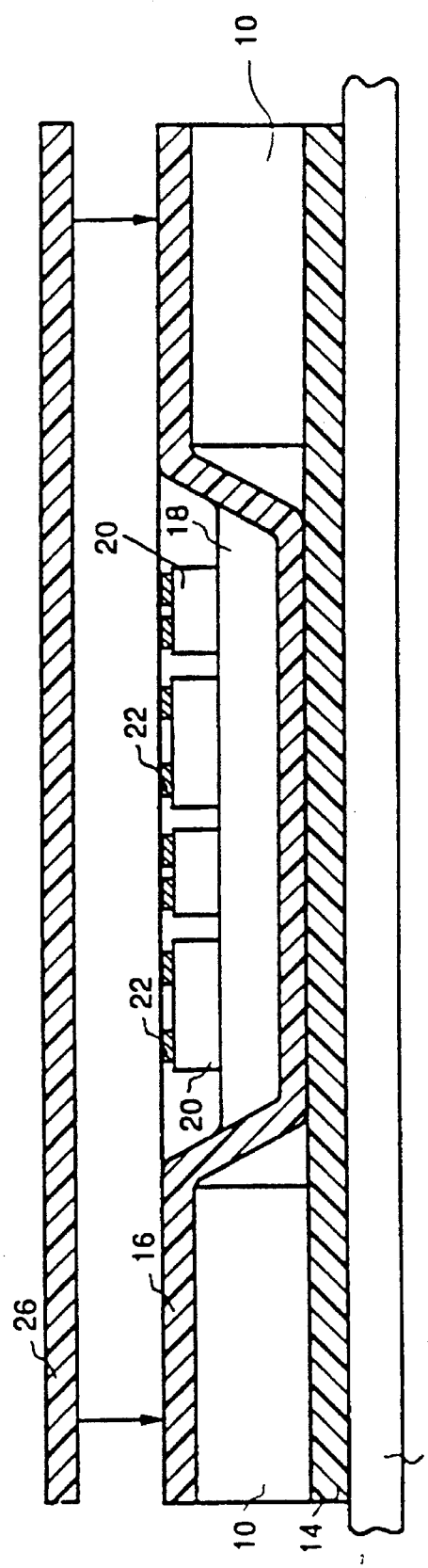
FIG. 4 is a view similar to that of FIG. 3, further showing chips on the surface of the substrate molding material and a laminatable dielectric layer which will be laminated to the carrier and substrate molding material.

FIG. 4 is a view similar to the embodiment of FIG. 3, further showing a plurality of integrated circuit chips 20 on the surface of the substrate molding material and a laminatable dielectric layer 26 which will be laminated to carrier 10 and substrate molding material 18. Chips 20, which need not all have the same thickness, can have adhesive on their backsides for chip attachment, or, if the carrier is warmed, the chips can be directly attached to the tacky molding material 18 surface. Laminatable dielectric layer 26 preferably comprises an ablatable material suitable as a support for a pattern of electrical interconnections, such as KAPTON® polyimide film coated with a partially cured polyimide/epoxy adhesive.

Alignment of the chips attached to the molding material can be made with respect to the edges of the surrounding well. Cleaning or surface preparation of the chips can be performed with an oxygen plasma treatment and solvent rinse, such as 2-propanol, after placement, if desired.

Figure 5:
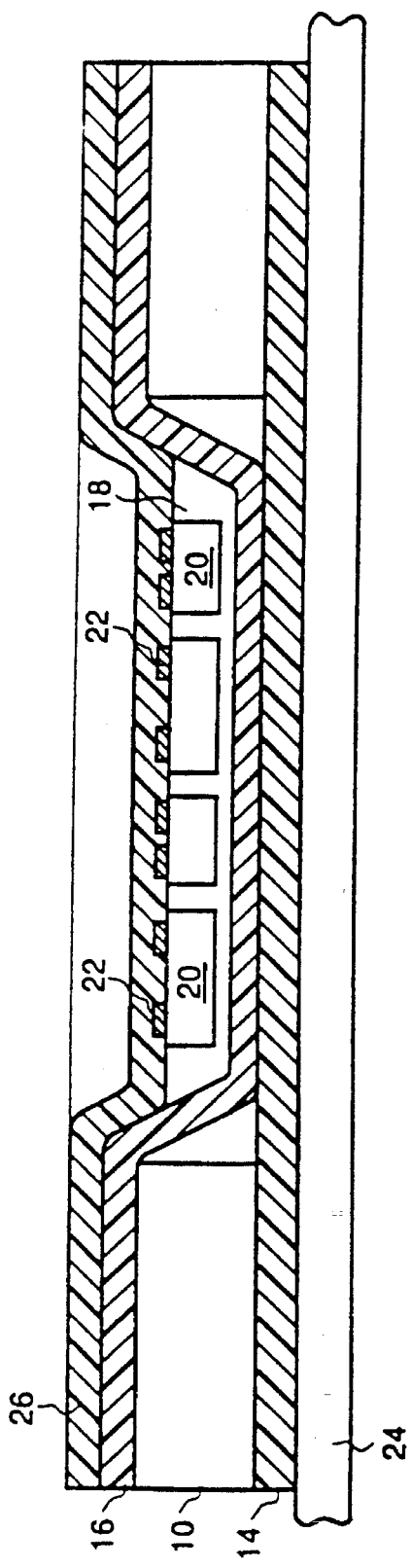
FIG. 5 is a view similar to that of FIG. 4, further showing chips embedded in the substrate molding material and the laminatable dielectric layer laminated on the substrate molding material.

FIG. 5 is a view further showing the chips of the embodiment of FIG. 4 embedded in substrate molding material 18, and laminatable dielectric layer 26 attached. In one embodiment, the laminatable dielectric layer is placed into a laminator at an ambient temperature of 80° C., with vacuum applied to the top and bottom sides of laminatable dielectric layer 26 to remove gases. After sufficient evacuation time to obtain a base vacuum of 100 millitorr (typically about 20 minutes), a pressure of about 10 to 20 psi (pounds per square inch) nitrogen is applied to the upper surface of dielectric layer 26 to press it against the chips, molding material 18, and protective dielectric layer 16. The lamination temperature is then ramped up to 180° C. while maintaining pressure, which first softens molding material 18, allowing flow around the chips and filling in voids, followed by curing of the epoxy to form a rigid substrate. The temperature is held at 180° C. for approximately one hour to finish curing of the epoxy/polyimide blend. The substrate is then cooled to a temperature below 100° C., pressure is released and the substrate is removed from the laminator, yielding a substrate with chips 20 embedded in molding material 18, with a laminatable dielectric layer 26 laminated to their top surfaces, as shown in FIG. 5.

Proper selection of the viscosity and rate of cure for both the molding material and the laminatable dielectric layer adhesive will result in completely encapsulated chips with a minimum of lateral movement and a planar, void free lamination. Slight relaxation of chip placement accuracy can be used to accommodate potential chip movement during initial lamination. Eichelberger et al., U.S. Pat. No. 4,835,704, issued May 30, 1989, describes an adaptive lithography system for forming the interconnections and is herein incorporated by reference.

Figure 6:
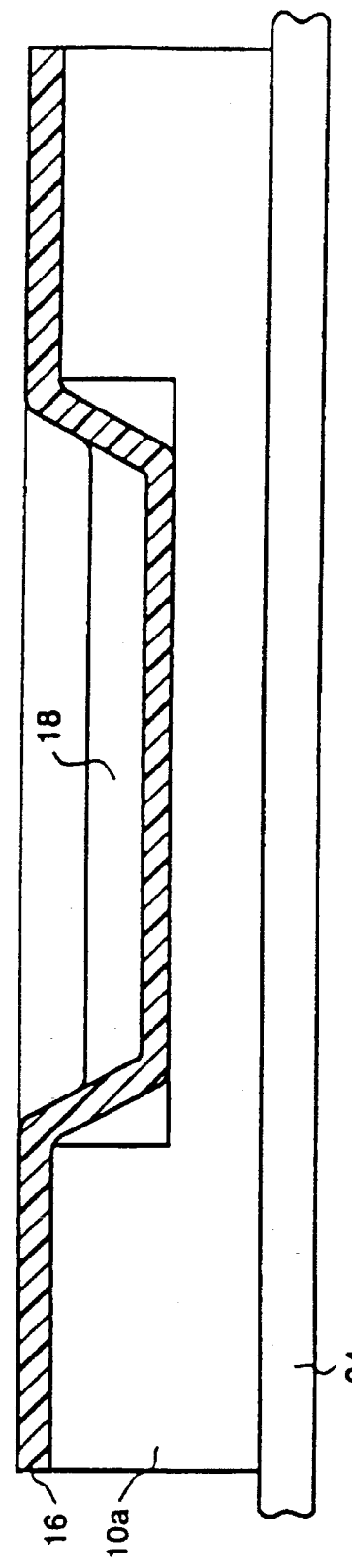
FIG. 6 is a view similar to that of FIG. 3, showing an alternative embodiment without a base sheet in which the carrier has a back.
Figure 7:
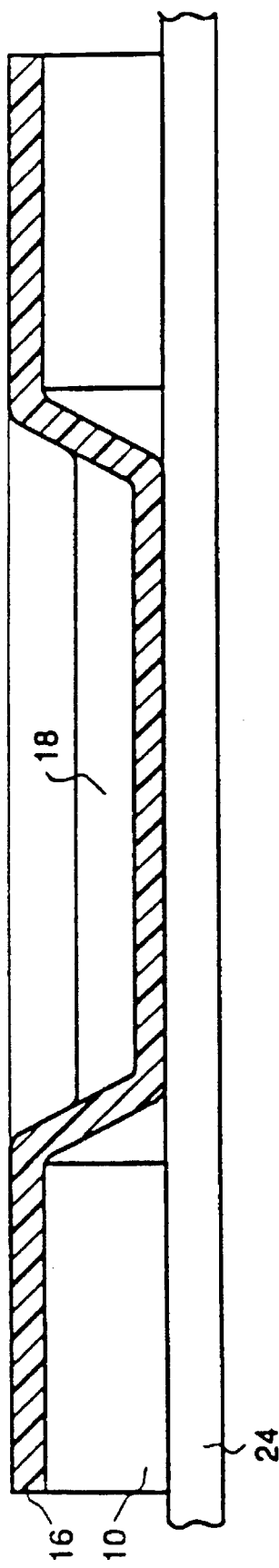
FIG. 7 is a view similar to that of FIG. 3, showing an alternative embodiment without a base sheet.
Figure 8:
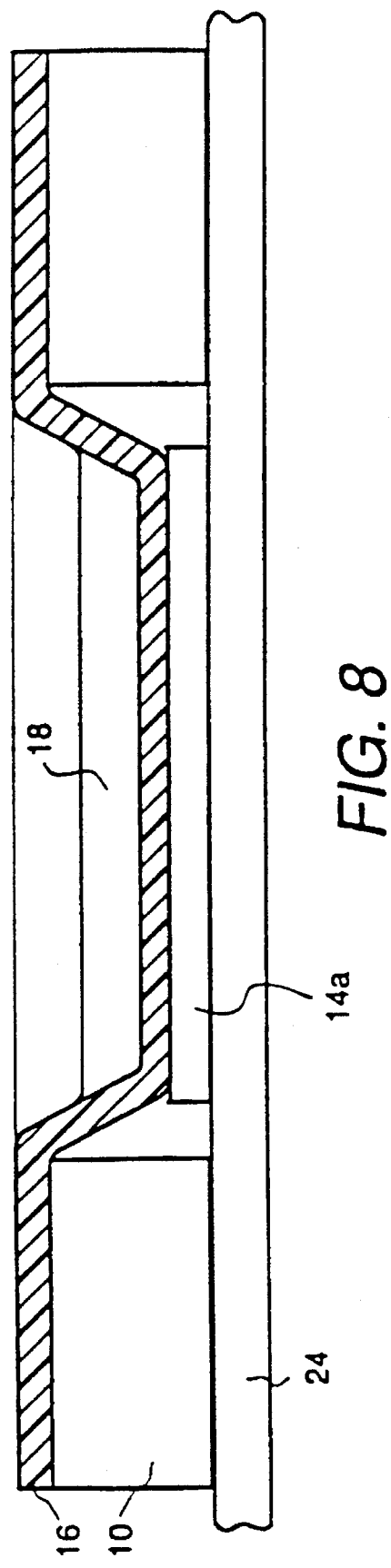
FIG. 8 is a view similar to that of FIG. 3, showing an alternative embodiment with a base sheet which is not attached to the carrier.

The present invention is not limited to embodiments in which a backless carrier has a base sheet and protective dielectric layer. For example, FIG. 6 is a view similar to that of FIG. 3, showing an alternative embodiment without a base sheet 14 (shown in FIG. 3) in which a carrier 10a has a back on which protective dielectric layer 16 is supported. FIG. 7 is a view similar to that of FIG. 3, showing an alternative embodiment without a base sheet. FIG. 8 is a view similar to that of FIG. 3, showing an alternative embodiment with a base sheet 14a not joined to carrier 10 and comprising a ceramic. FIG. 9 is a view similar to that of FIG. 3, showing an alternative embodiment without a protective dielectric layer such as layer 16 employed in the embodiments described previously. FIG. 10 is a view similar to that of FIG. 6 in which carrier 10a includes a back, but without a protective dielectric layer. With the embodiment of FIG. 10, substrate 18 is difficult to remove from the carrier; the substrate can be kept in the carrier, if desired. The remaining discussion with respect to the embodiments of FIGS. 11–15(d) is applicable to each of the embodiments of FIGS. 3 and 6–10.

FIG. 11 is a view showing a plurality of vias 30 and a pattern of electrically conductive interconnections 32 through laminatable dielectric layer 26 of the embodiment of FIG. 5. Vias 30 can be formed by using a laser or a mask etch process, with the preferred technique being that described in aforementioned U.S. Pat. No. 4,894,115. These vias are aligned with chip pads 22. The pattern of electrically conductive interconnections 32 can be formed by sputtering or plating, for example, and patterned with a standard photoresist and etch process. Aforementioned Eichelberger et al., U.S. Pat. No. 4,835,704, describes an adaptive lithography system useful for forming the interconnections. The preferred interconnection material is a composite structure of titanium:copper:titanium. Multiple layers of dielectric material having vias and supporting patterns of electrically conductive interconnections (not shown) can be applied, if desired. In a preferred embodiment, an outer dielectric layer 28 is applied to buffer the interconnections. Outer dielectric layer 28 can comprise, for example, a polyimide/epoxy coated KAPTON® polyimide film. An outer interconnection 38 can then be formed in a similar manner as the pattern of electrically conductive interconnections.

FIG. 12 is a view similar to that of FIG. 11, further showing back vias 34 and electrically conductive thermal paths 36 for the chip backsides. The back vias and thermal paths can be formed in the same manner as discussed with respect to vias 30 and electrically conductive interconnections 32 in the embodiment of FIG. 11. Preferably the thermal paths comprise a material such as a composite structure of titanium:copper:titanium.

FIG. 13 is a view of chips 20 embedded in laminatable dielectric layer 26. An alternative process to individually placing chips having adhesive-coated backsides on substrate molding material (discussed with respect to the embodiment shown in FIG. 4) is to place the chips face down in predetermined locations on a partially cured laminatable dielectric layer 26 to hold them in place. Then the laminatable dielectric layer is applied to a carrier such as carrier 10, shown in FIG. 4, so that the chips contact substrate molding material 18, shown in FIG. 4, and laminatable dielectric layer 26 is laminated to the carrier.

Alternatively, the chips can be attached face up on the surface of a flat or partially milled ceramic substrate to obtain a somewhat equal chip and device height above the substrate by using a thermoplastic or partially cured thermosetting adhesive which is heated on a hot plate and then pressed into the adhesive-coated side of a partially cured laminatable dielectric layer. Cooling the chips and laminatable dielectric layer results in excellent adhesion of the chips to the laminatable dielectric layer.

Substrates such as shown in the embodiments of FIGS. 11 and 12, for example, can be removed from carrier 10, if desired, by cutting or ablating through base sheet 14, as well as laminatable and outer dielectric layers 26 and 28, respectively, and protective layer 16 at the substrate perimeters. Several substrates can be prepared in a single well and then cut following final fabrication to obtain individual circuit assemblies.

FIGS. 14(a)–14(d) are views illustrating a process for applying an initial metal pattern on substrate molding material 18. It would be desirable to have a metal pattern placed on the molded substrate itself to provide partial interconnection between the chips and potentially reduce the number of upper interconnection layers required. Application of a thin protective coating 40 over the partially cured mold, such as 4μ thickness of SPI (siloxane polyimide) polymer, to protect it during metal fabrication steps is possible if necessary, as shown in FIG. 14(a). The protective coating comprises a material which has a low glass transition point and can have its solution baked out without curing the molding material. Substrate metal 42 can then be applied and patterned directly over protective coating 40. Chips 20 are placed on the protective coating surface in openings which are patterned into substrate metal 42, as shown in FIG. 14(b). During subsequent lamination of laminatable dielectric layer 26, the protective coating softens and blends with the polyimide/epoxy molding material, causing immersion of the chips into the molding material so as to allow encapsulation of the chips, as shown in FIG. 14(c). Chip pads 22 are then interconnected with each other and with substrate metal 42, as shown in FIG. 14(d), in the same manner as discussed with respect to the embodiment of FIG. 11.

Figure 15D:
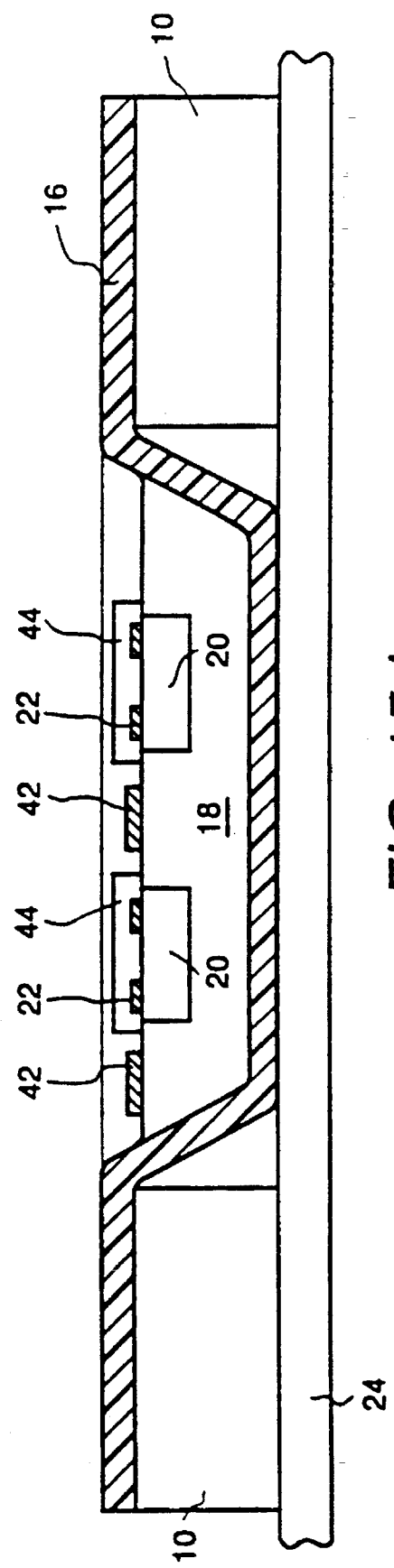

FIGS. 15(a)–15(d) are views illustrating a process for leaving chips 20 uncovered and applying an initial metal pattern. A layer of TEFLON® polytetrafluoro-ethylene (TEFLON® is a trademark of E.I. dupont de Nemours and Co.) is used as the initial dielectric layer, such as laminatable dielectric layer 26 shown in FIG. 4, for the first lamination and substrate cure step. This material can easily be peeled away after lamination, leaving the structure shown in FIG. 15(a). If desired, the TEFLON® polytetrafluoroethylene can be removed in a manner so as to leave the chips covered, or another material 44, such as KAPTON® polyimide film, can be applied over the chips, as shown in FIG. 15(b), and patterned, as shown in FIG. 15(c). As further shown in FIG. 15(c), a sheet of metal 42 can be applied over the patterned material 44 and substrate molding material 18. Metal 42 can then be patterned, as shown in FIG. 15(d).

The following illustrative examples are not intended to limit the scope of this invention but to illustrate its application and use:

EXAMPLE 1

The embodiment shown in FIG. 5 was reduced to practice in the following manner using a solvented approach. An approximately 6 inch diameter carrier was obtained using a 50 mil thick, flat titanium metal plate into which a 2.1 inch square hole was stamped out. KAPTON® polyimide film coated with ULTEM® polyetherimide adhesive was laminated to each side of the carrier simultaneously with a nitrogen pressure lamination using the following procedure. The carrier, adhesive coated KAPTON® polyimide films (base sheet and protective dielectric layer) and the base, were loaded into a laminator set at a temperature of 150° C. The laminator was closed and vacuum was applied to remove gases until a base vacuum of 100 millitorr was reached. Pressure of 30 psi was then applied to the top surface of protective dielectric layer, pressing it against the carrier and base sheet to form a well, while ramping the temperature to 300° C. to melt the ULTEM® polyetherimide adhesive. The laminator was held at 300° C. for 30 minutes, cooled under pressure, and then opened to remove the carrier, resulting in the embodiment shown in FIG. 2.

A solution of substrate molding material comprised 50 grams D9000 siloxane polyimide; 10 grams CY179 epoxy (available from Ciba Geigy Corp., Hawthorne, N.Y.); 40 grams DER 662 epoxy; 1 gram octyloxyphenyl (phenyl)iodonium hexafluoroantimonate catalyst; 100 grams anisole solvent; and 20 grams cyclopentanone solvent (anisole and cyclopentanone solvents available from Aldrich Chemical Co., Milwaukee, Wis.). This solution was twice poured into the well, coated with KAPTON® polyimide film, with an approximate 2 hour 100° C. hot plate bake between additions. The final partial cure bake sequence included 15 hours at 100° C. on a hot plate followed by 24 hours at 100° C. in a vacuum oven at a reduced pressure of 100 Torr, resulting in 2.2 grams of partially cured polyimide/epoxy in the well for a thickness of 30 mils. Chips having a thickness of 20 mils were added directly to the surface of the molding material using epoxy adhesive, which was partially cured at a temperature of 100° C. for 30 minutes. The chips and carrier were overlaid with a 1 mil thick KAPTON® polyimide film coated with 15 µm thick partial cured polyimide/epoxy adhesive layer. The parts were placed into a laminator at an ambient temperature of 80° C., with vacuum applied to the top and bottom sides of the overlay dielectric to remove gases. After sufficient evacuation time to obtain a base vacuum of 100 millitorr (typically about 20 minutes), nitrogen gas at a pressure of 20 psi was applied to the upper surface of the overlay dielectric to press it against the chips, molding material, and underlying protective dielectric layer. The lamination temperature was ramped up to 180° C. while maintaining pressure, and held at temperature for approximately 1 hour to finish curing the epoxy/polyimide blend. The carrier was then cooled to below 100° C., pressure was released, and the carrier was removed from the laminator, yielding a substrate with the chips embedded in molding material which was void free with the laminatable dielectric layer laminated to the top surface, as shown in FIG. 5.

EXAMPLE 2

The embodiment shown in FIG. 5 was reduced to practice in the following manner using a solventless approach. Nine grams of DER 662 epoxy resin flake was ground into a powder using a mortar and pestle. Into this powder was added 9 grams of D9000 siloxane polyimide polymer and 0.09 grams of octacat catalyst. The mixture was blended further and a portion was added into a pocket formed by KAPTON® film laminating over a backless metal carrier. A 1 mil TEFLON® film release layer was applied between the mirror-imaged mold template (used to form spaces to place the chips) and the imide/epoxy powder before loading into the vacuum/pressure laminator. The assembly was heated under vacuum for 30 minutes at 110° C. The system was then heated to 150° C. with pressure applied to the mold template for 10 minutes and then cooled to room temperature.

After removal from the laminator, silicon chips were attached to the molded pockets and a D9000/epoxy partial cured frame overlaid onto the chips and laminated to the part using standard multilamination procedures. This completely embedded the chips with negligible die movement during lamination. Removal of the part from the carrier gave an all plastic, KAPTON® encased HDI module with embedded chips.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a multi-chip module substrate, comprising the steps of:

providing a carrier having a carrier well therein;

providing substrate molding material in the carrier well;

applying a protective coating over the substrate molding material;

forming a layer of metal over the protective coating patterned so as to leave holes extending through the metal layer to the protective coating;

situating a plurality of circuit chips, by placing at least one of said plurality of chips in a predetermined one of said holes of said layer of metal in said protective coating and through a surface of the molding material, each chip having a plurality of chip pads which face away from the away from the substrate molding material; and laminating a laminatable dielectric layer over the substrate molding material at a predetermined temperature and a predetermined pressure so that the substrate molding material flows and encapsulates at least one of the plurality of chips, and with the protective coating blending with the substrate molding material.

2. The method of claim 1, wherein the carrier comprises a backless carrier: the step of providing the carrier comprises applying a base sheet on one side of the backless carrier, and the step of applying a base sheet comprises applying a sheet comprising dielectric material.

3. The method of claim 2, further including the step of applying a protective dielectric layer over the interior surface of the carrier well prior to pouring the substrate molding material.

4. The method of claim 1, wherein the step of providing the carrier comprises providing a carrier having a back for defining a bottom surface of the well.

5. The method of claim 4, further including the step of applying a protective dielectric layer on the interior surfaces of the carrier well prior to pouring the substrate molding material.

6. The method of claim 1, wherein the step of situating the plurality of chips in the substrate molding material comprises the steps: of placing each of the chips with a back surface thereof down into the laminatable dielectric layer; hardening the laminatable dielectric layer to hold the plurality of chips in place; and placing the laminatable dielectric layer, with the side bearing the chips toward the substrate molding material prior to the step of laminating the laminatable dielectric layer.

7. The method of claim 1, wherein the substrate molding material comprises one of the group consisting of epoxy/polyimide, polyimide, epoxy/polysulfone, and epoxy.

8. The method of claim 7, wherein each component of the substrate molding material is dissolved in a common solvent selected to dissolve all components of the selected molding material.

9. The method of claim 7, wherein the substrate molding material is solventless.

10. The method of claim 1, further including the steps of: providing vias in the laminatable dielectric layer and aligned with a selected predetermined pattern of the chip pads: and applying a pattern of electrical conductors extending through the vias to interconnect the selected pattern of chip pads.

11. The method of claim 10, further including the steps of: providing a via in the substrate molding material aligned with one of the chip backsides: and applying an electrical conductor extending through that via to that one chip backside.

12. The method of claim 1, wherein the laminatable dielectric layer comprises polytetrafluoroethylene, and further including the step of removing the polytetrafluoroethylene after laminating the polytetrafluoroethylene.

13. The method of claim 12, further including the step of forming a patterned mask over the chip pads.

14. The method of claim 1, wherein the step of providing a carrier having a carrier well therein comprises placing a backless carrier having a well on a base and placing a ceramic slab in the well on the base, beneath the laminatable dielectric layer.

15. A method for fabricating a multi-chip module substrate, comprising the steps of:

providing a carrier having a carrier well therein;

providing a first layer of a dielectric material in the carrier well;

providing a quantity of a substrate molding material in a well of the dielectric layer located in the carrier well;

situating a plurality of integrated circuit chips, each with at least one chip pad, in the substrate molding material, with the chip pad facing away from the molding material; and laminating another dielectric layer to the first layer and over the substrate molding material and the plurality of circuit chips, at a predetermined temperature and a predetermined pressure so that the substrate molding material, now encapsulated between the first and another layers, flows and encapsulates at least one of the plurality of chips.

16. The method of claim 15, further comprising the step of providing a base layer beneath the first dielectric layer, prior to introducing the molding material into the well in the first layer.

* * * * *